United States Patent [19]

Robinson et al.

[11] 4,258,266
[45] Mar. 24, 1981

[54] ION IMPLANTATION SYSTEM

[75] Inventors: William P. Robinson, Newberry Park; Robert L. Seliger, Agoura, both of Calif.

[73] Assignee: Hughes Aircraft Company, Culver City, Calif.

[21] Appl. No.: 61,578

[22] Filed: Jul. 30, 1979

[51] Int. Cl.³ .................... H01J 37/00; B01D 59/44
[52] U.S. Cl. ........................... 250/492 A; 250/442
[58] Field of Search ........... 250/492 R, 492 A, 492 B, 250/398, 442; 313/359, 360, 362, 363, 433

[56] References Cited

U.S. PATENT DOCUMENTS

| | | | |
|---|---|---|---|
| 3,689,766 | 9/1972 | Freeman | 250/492 A |
| 3,778,626 | 12/1973 | Robertson | 250/492 A |
| 3,983,402 | 9/1976 | Arndt et al. | 250/492 A |
| 4,017,403 | 4/1977 | Freeman | 250/492 A |
| 4,163,151 | 7/1979 | Bayless et al. | 250/423 R |

*Primary Examiner*—Bruce C. Anderson
*Attorney, Agent, or Firm*—Allen A. Dicke, Jr.; W. H. MacAllister

[57] ABSTRACT

The ion implantation system includes a separate vacuum housing 102 for the ion source and the target chamber 118. The ribbon beam ion source 10 provides a footprint 162 on the wafer wheel 126 of such shape as to permit short traverse of the wafer wheel 126 for full wafer scan.

5 Claims, 9 Drawing Figures

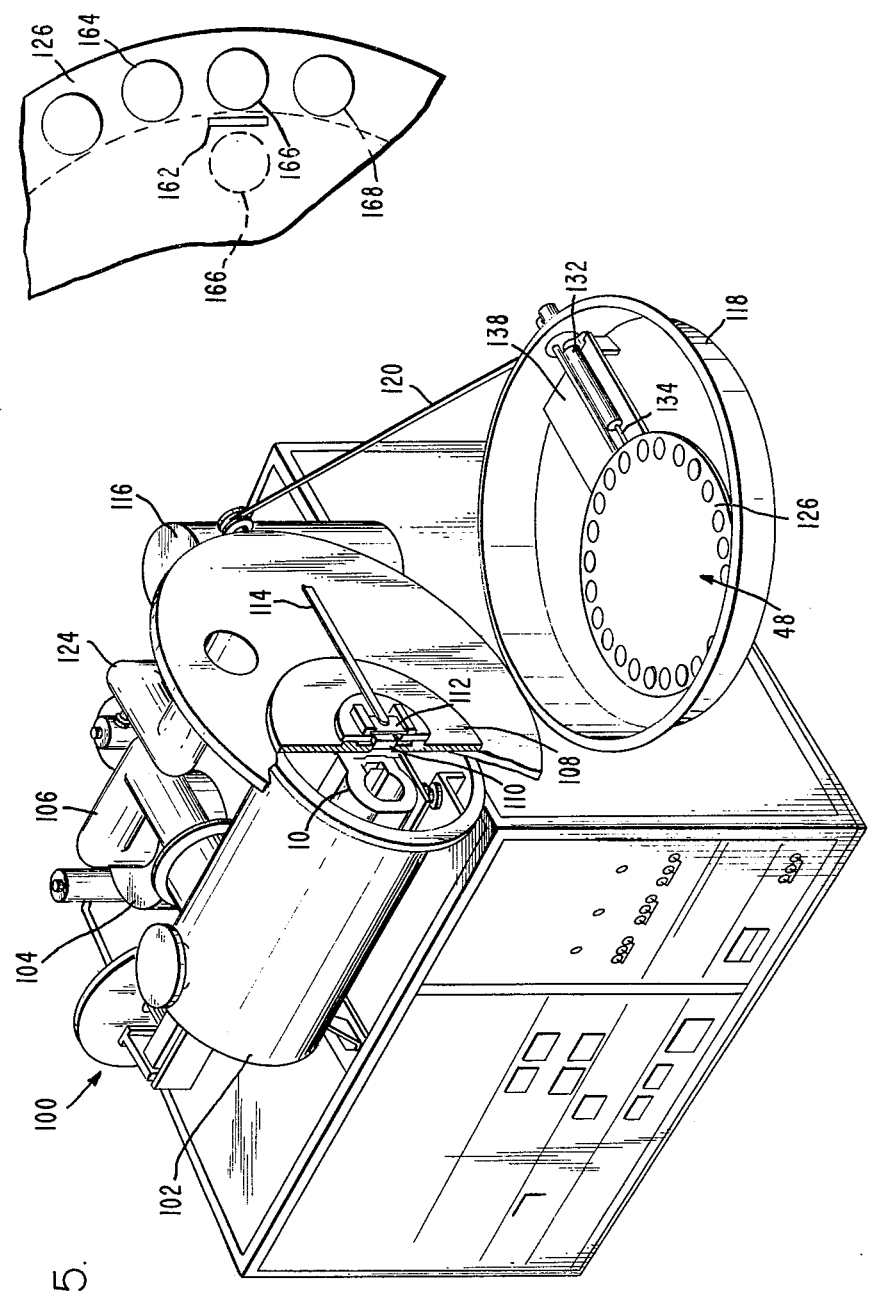

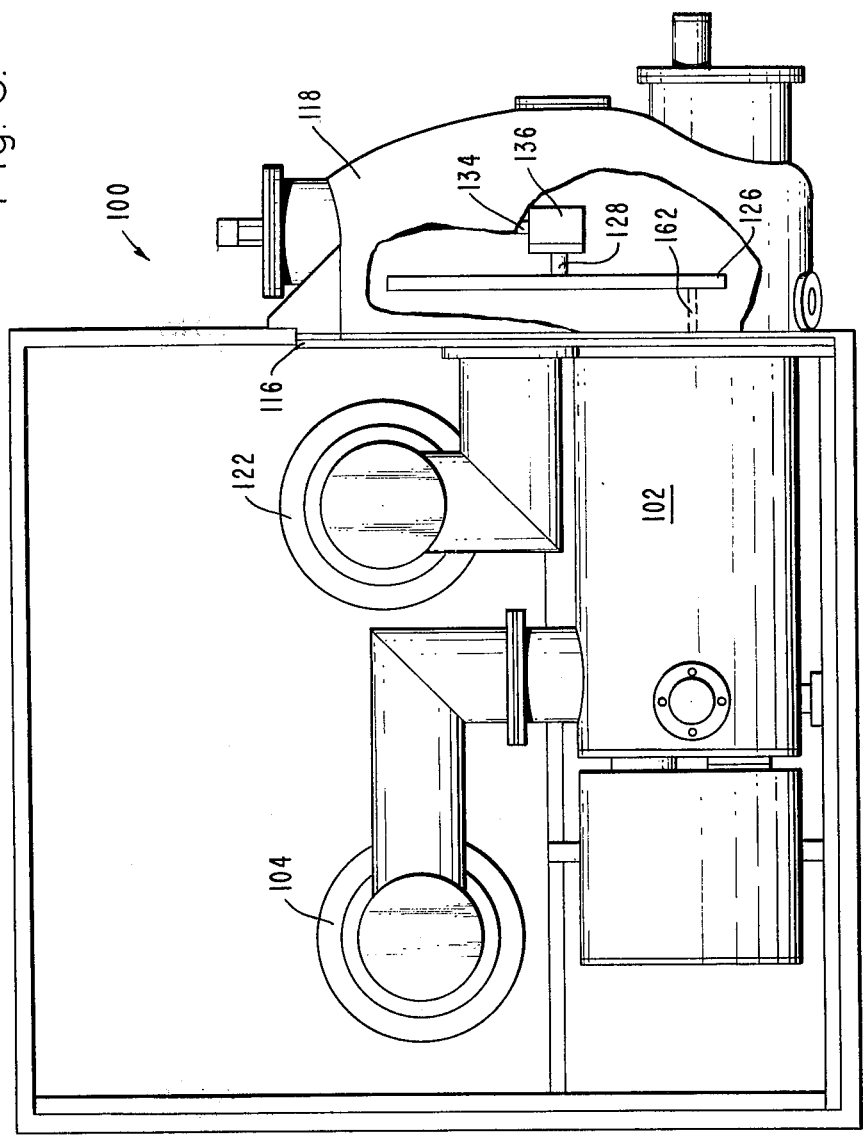

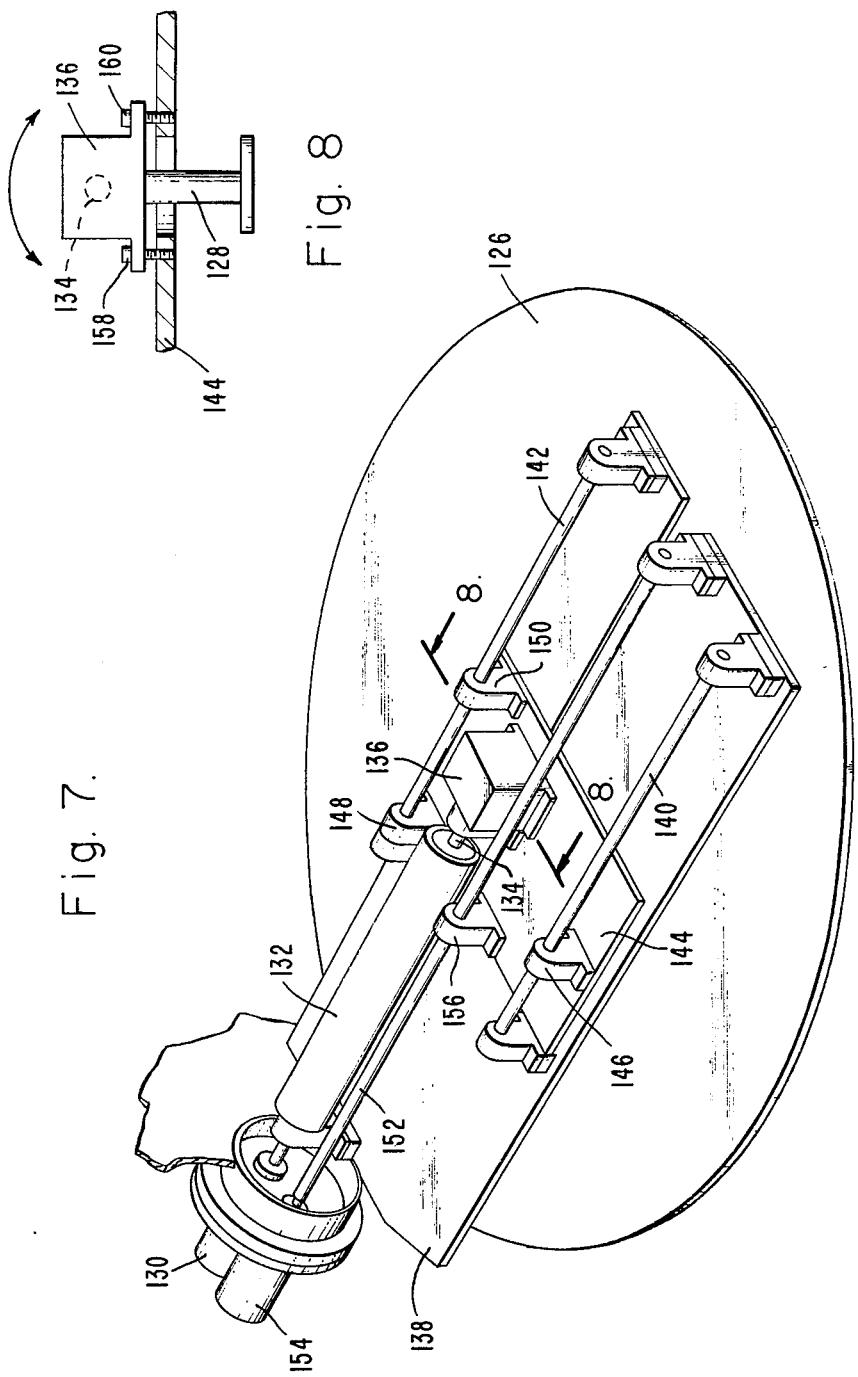

ION IMPLANTATION SYSTEM

The U.S. Government has the rights in this invention pursuant to Contract N00123-77-C-1099 awarded by the Department of Defense.

CROSS REFERENCE

This application is related to patent application Ser. No. 865,280, filed Dec. 28, 1977, now U.S. Pat. No. 4,163,151 granted July 31, 1979.

BACKGROUND OF THE INVENTION

This invention is directed to an ion implantation system which has a separated ribbon beam ion source which has geometry which permits wafer traverse with minimum waste beam for maximum productivity and employs the same magnetic field source.

Prior ion implantation beam sources were comprised of separate functional components which were connected together to form the ion beam line. An ion source was used and it had its own magnetic field structure if such was required for the production of the ion beam. Ion separation downstream from the ion source required additional separation components. Due to the separate-element approach to the problems, the beam line is unnecessarily long and complex. These disadvantages are particularly bad in the case of high current low energy beams because severe space charge expansion occurs in the region between the ion source and separator. Attempts to locate the separator just downstream of the ion source were unsuccessful because the magnetic fields interferred. That is, the axial magnetic field in the ion source was disturbed by the transverse magnetic field of the separator.

With such a close coupled, compact ion source, a small surce chamber can be employed. A target chamber with a wafer wheel can be positioned directly adjacent thereto, and with associated equipment provide a compact ion implantation system.

SUMMARY

In order to aid in the understanding of this invention it can be stated in essentially summary form that it is directed to an ion implantation system wherein the compact ion source provides a ribbon beam which is directed at a wafer wheel, with the wafer wheel traversed in the narrow direction of the beam to minimize overscanning. The rectangular cross-section of the beam produced by the ion source also reduces the effects of space-charge and enables mass separation to occur in a relatively weak magnetic field.

It is thus an object of this invention to provide an ion implantation system which comprises a separated ion source which has both the ion production structure and the ion separation structure therein coupled to wafer handling equipment.

It is a further object to provide an ion implantation system wherein the beam line is short to provide a compact system. It is another object to provide an ion implantation system wherein a wafer support wheel moves a plurality of wafers successively past a rectangular ion beam and traverses the wafers with respect to the ion beam in the narrow direction of the beam cross-section so that nonimplantation time is minimized.

Other objects and advantages of this invention will become apparent from a study of the following portion of the specification, the claims and the attached drawings.

BRIEF DESCRIPTION OF THE DRAWINGS

FIG. 5 is a perspective view of the equipment which houses the ion implantation system of this invention.

FIG. 6 is a plan view thereof.

FIG. 7 is an isometric view of the wafer wheel drive mechanism from the rear thereof, with parts broken away.

FIG. 8 is an enlarged end view of the wafer wheel gear box showing the details of the mounting thereof.

FIG. 9 is a plan view of a portion of the wafer wheel, with parts broken away.

DESCRIPTION OF THE PREFERRED EMBODIMENTS

Figure 1:
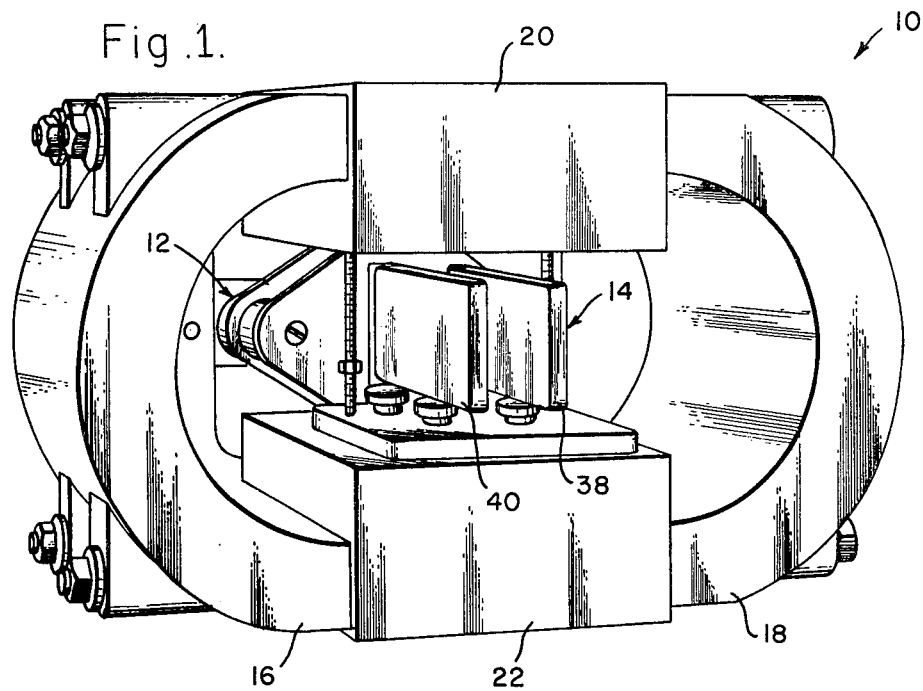
FIG. 1 is a perspective view of the separated ion source employed in the system of this invention.
Figure 2:
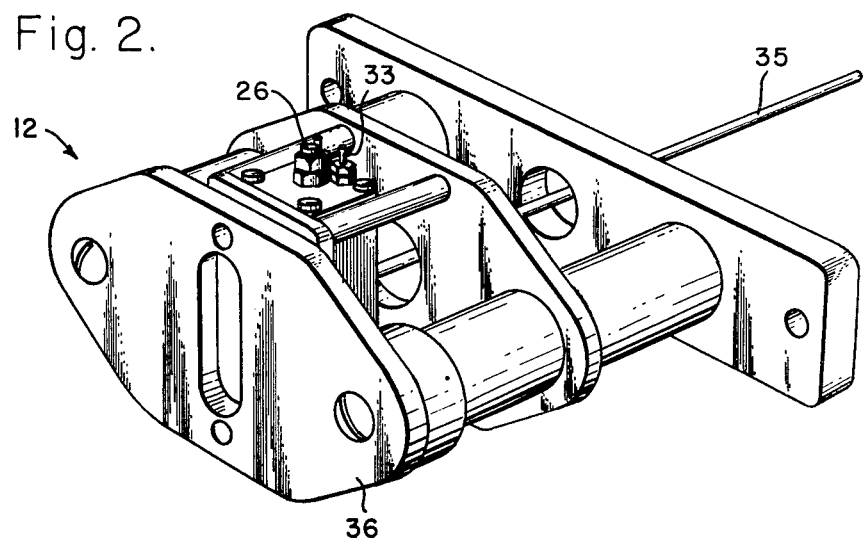
FIG. 2 is an enlarged perspective of the ion source portion of the separated ion source equipment.
Figure 3:
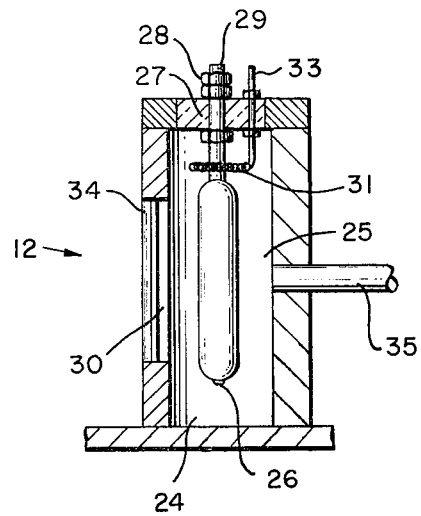
FIG. 3 is a vertical section through a portion of the ion source.
Figure 4:
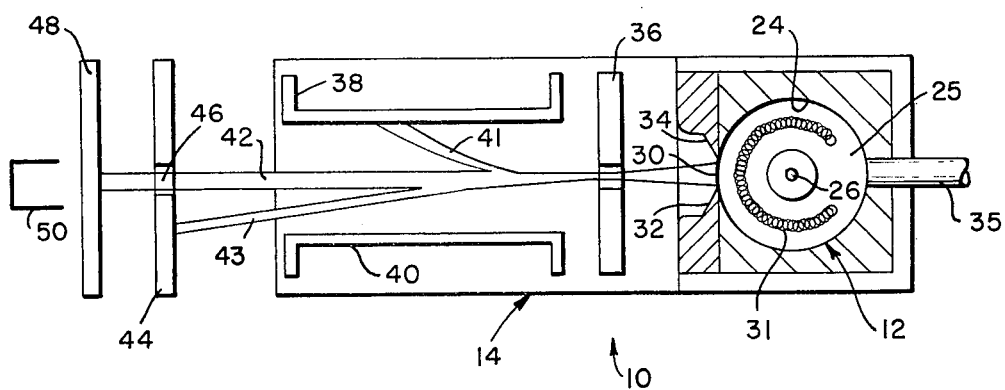
FIG. 4 is a schematic horizontal section through the separated ion source showing the interrelated components.

The separated ion source of this invention is generally indicated at 10 and FIGS. 1, 4 and 5. It comprises ion source 12, which is seen in FIGS. 2, 3, and 4 and ion separator 14 which is seen in FIGS. 1 and 4. Magnets 16 and 18, see FIG. 1, connected to pole pieces 20 and 22, provide a magnetic field across both the ion source and the ion separator.

Ion source 12 has a Penning discharge type configuration. The cathode 24 has an interior cylindrical cathode surface. Anode 26 is positioned within the cathode and is electrically insulated therefrom by means of insulator 27 in the top cover 28. Anode 26 extends through the top-cover insulator 27 to provide a terminal 29 to which the anode voltage is applied. Hot filament 31 is positioned adjacent the anode and has terminals 33 for hot filament energization which also extend from the cathode space through the top cover. The gas to be ionized is introduced into the discharge chamber 25 by means of a feed tube 35. The radii of the anode and cathode surfaces, the gas pressure and the magnetic field strength in the interelectrode spaces are such that a Penning low pressure glow discharge is formed. The Penning discharge causes ionization and it is from this discharge plasma that the ions are extracted.

The magnetic field is supplied in a direction parallel to the anode and has a value of about 1100 gauss at the center of the ion source. In the presence of the gas to be ionized, with a pressure in the discharge chamber in the order of about 100 microns, a Penning discharge is sustained in discharge chamber 25 between the anode and cathode with a voltage of 100 to 150 volts. Electrons, which ionize the gas molecules, are provided by hot filament 31. The magnetic field causes the path length of electrons travelling between the cathode and the anode to be much greater than their separation. This increases the probability of ionization and in turn results in a gas consumption which is less than one tenth the gas consumption required without a magnetic field. After ignition, the discharge operates at a voltage in the range of 75 to 125 volts and at a discharge current of 100 to 1000 milliamperes. The discharge is very stable and since the discharge voltage is lower than for most types of cold cathode discharge, sputtering is less of a problem.

Ions are extracted from the discharge through a slit 30 in the discharge chamber 25. The slit 30 has a high aspect ratio rectangular cross section whose long dimension is shown in FIG. 3 and whose narrow dimension is shown in FIG. 4. The extraction geometry is based on the design criteria developed by J. R. Pierce. Electrodes 32 and 34 adjacent the slit are Pierce-type electrodes to prevent space charge effects from spreading the beam. Furthermore, the strip beam geometry of high aspect ratio which is typically 50 times higher than its width, reduces space charge effects and it is compatible with the separator geometry. Accelerator electrode 36 is positioned adjacent the ion extraction opening and accelerates the ion beam into the ion separator.

Ion separator 14 comprises separator plates 38 and 40 which are positioned in the magnetic field and oriented parallel to the ribbon beam. A power supply applies a voltage of 1500 volts across the separator plates to provide an electric field at right angles to or crosswise to the magnetic field which is perpendicular to the paper in FIG. 4. Thus, the magnetic field and the electric field define the E x B ion separator. The same permanent magnet is used to provide the magnetic field in the ion source and thus it is possible to reduce the system length as compared to other designs. Furthermore, in the present design, the permanent magnet is within the vaccum envelope 102. Thus, the permanent magnetic field can be provided at very much lower cost than the customary external electro-magnet. The magnetic field in the separator region has a value of 1100 gauss.

The main beam is indicated at 42 in FIG. 4. This beam has been analyzed, with impurity beams 41 and 43 being separated therefrom. Aperture plate 44 has analyzing opening 46 therein which permits the main beam to pass through the target holder 48. The target holder is preferably movable into the path of the beam, and may have an opening therein so that when the opening in the target holder is moved in line with the beam, the beam can pass through to faraday cup 50. By use of the cup, beam data can be obtained.

In a particular embodiment, the slit 30 through which the beam is extracted measures 1 inch by 0.020 inches. When the source is operating on argon or $BF_3$, with a ten KV extraction voltage, the total current is 2.5 milliamperes. When the gas is $BF_3$ operating under these conditions, 150 microamperes of boron is delivered through analyzing opening 46 of the target.

The ribbon shape of the beam is critical to this invention. In a ribbon shaped beam, a high beam current can be achieved with a narrow beam. The narrow beam configuration very much reduces the spreading of the beam due to space charge effects, as compared to a circular beam of the same current. Furthermore, in analyzing the beam, the impurities can be laterally deflected from the ribbon beam, but need only be deflected a small angle because the main beam can pass through an analyzing opening which is in the shape of an elongated slot, having generally the same proportions as the extraction slot at which the ions are extracted from the plasma. Thus, by using a beam which is taller than it is thick, and causing analyzing deflections of the impurities in the direction of the thickness direction, a high brightness, high flux density ion beam can be achieved by minimum spreading due to space charge effects and maximized analyzing.

The ion implantation system of this invention which incorporates the separated ion source 10 is generally indicated at 100 in FIGS. 5 and 6. System 100 has vacuum envelope 102 which houses the ion source 10. Ion source 10 is oriented in such a direction that its ribbon beam is horizontally directed toward the front right in FIG. 5 with the height of the beam, upright in FIG. 5, being the longer transverse section through the beam. Envelope 102 is pumped by vacuum pump 104 through vacuum connection 106. The right end of envelope 102 is substantially closed by cover 108 which is half broken away in FIG. 5. Cover 108 only has slot 110 therethrough. Sliding gate 112 can be slid from a position where it covers slot 110 to a position where it uncovers slot 110. Sliding gate 112 is sealed when closed so that envelope 102 can be maintained at vacuum while the target chamber volume on this side of cover 108 is open. Gate operator 114 extends to the outside of the vacuum enclosure so that the gate can be externally operated.

Flange 116 is mounted behind cover 108. Target chamber cover 118 is pivoted to the bottom of flange 116 and can be swung to the open position shown in FIG. 5 Stop 120 holds cover 118 in a horizontal position when open. When raised against flange 116, a target chamber cover 118 can be sealed thereto to form an enclosed target chamber which can be evacuated. Vacuum pump 122 is connected through vacuum connection 124 to the target chamber to permit the target chamber to be evacuated. By closure of sliding gate 118, the target chamber can be opened by lowering cover 118, while maintaining the vacuum in vacuum envelope 102. The maintenance of the vacuum on the ion source is helpful to the ion source and the reduction in volume which must be pumped down after a change in targets decreases the down time between the implantation on one set of wafers and the next set of wafers.

Wafer wheel 126, see FIGS. 5, 6, 7 and 9, is a mounted for rotation on wheel shaft 128, see FIGS. 6 and 8. Wafer wheel drive motor 130 drives female spline 132 which in turn drives male spline 134 which is connected to bevel gear box 136. Wafer wheel shaft 128 extends out of the gear box and wafer wheel 126 is thus driven by motor 130.

In addition to the rotation of wafer wheel shaft 128 about its own axis, two additional motions can be imparted to it. Face plate 138 is rigidly mounted in the target chamber cover 118 and carries thereon guide rods 140 and 142. Carrier plate 144 has guide bushings 146, 148 and 150 thereon so that carrier plate 144 can move parallel to guide rods 140 and 142. The guide rods are parallel to the splines 132 and 134 so that rotary drive can be imparted to male spline 134 during translation of carrier plate 144 along its guide rods. Lead screw 152 is driven by positioning motor 154. Nut 156 is secured to carrier plate 144 so that rotation of positioning motor 154 causes traverse of carrier plate along its guide rods. This motion is in the axial direction of male spline shaft 134 and is at right angles to the wafer wheel shaft 128. The motion is up and down in FIG. 6. In addition, screws 158 and 160 engage through flanges on the base of bevel gear box 136 with respect to carrier plate 144 so that by adjustment of the screws the angle of shaft 128 around the axis of shaft 134 can be adjusted. This adjustment is of only a few degrees and is only occasionally made and therefore is not motorized.

A plurality of wafers is mounted on the front of wafer wheel 126. These wafers are of semiconductor material and are masked to receive ions from the ion beam 162, see FIGS. 6 and 9 for implantation therein. The masking controls the implantation pattern. FIG. 9 illustrates wafers 164, 166, and 168 secured to the wafer wheel. During the implantation process the wheel 126 is rotated so that the implantation is evenly distributed. For proper dosage accuracy, the beam flux onto the wafer must be uniform within 1 per cent over the wafer area. To accomplish this, the wafer wheel is rotated around the axis of shaft 128 to rotate the wheel and the wafer is carried thereby past the impingement pattern of beam 162. As is seen in FIG. 9, beam 162 is a ribbon beam and its height is perpendicular to the radius of the wafer wheel. With rotation of the wafer wheel the wafers move in an arcuate direction, but at the ribbon beam they are generally moving parallel to the height cross-section of the beam. The wafer wheel is rotated and traversed so that the wafers pass under the beam pattern on the wheel. In addition to the rotary motion of the wheel, it is moved in the direction parallel to male spline shaft 134 which is a direction perpendicular to the longer cross-section. It is the left to right direction in FIG. 9. The importance of this direction of traverse is that scanning must occur from a point where the beam pattern is on one side of the wafer at a starting point, with motion of the wheel perpendicular to its rotational axis while the pattern scans across the wafer areas, to a point where the pattern is outside of the wafer areas, as shown in dotted line in FIG. 9. In this way scanning on the wafer wheel cross-wise of the beam from a point where the pattern is on one side of the wafers to a point where the pattern is on the other side of the wafers can be accomplished with less traverse of the wafer wheel because of the narrowness of the ribbon beam in the direction of traverse. In this way, the use of a ribbon beam improves productivity of the system. Tilting of gear box 136 and shaft 128 by adjustment screws 156, 160 is occasionally required for special purposes and only occurs through a few degrees. This motion does not adversely affect the employment of the ribbon beam as it impinges on the wafer wheel and wafers carried thereby.

This invention has been described in its presently contemplated best mode and it is clear that it is susceptible to numerous modifications, modes and embodiments within the ability of those skilled in the art and without the exercise of the inventive faculty. Accordingly, the scope of this invention is defined by the scope of the following claims.

Claims:

1. An ion implantation system comprising:

A high current separated ion source for producing along a beam path a high aspect ratio ribbon shaped ion beam having a height and a thickness with its height substantially greater than its thickness in a direction perpendicular to ion flow along the beam, said separated ion source including magnetic field means for producing a magnetic field in the direction of the height of the beam across the beam path and first and second separator electrodes positioned on opposite sides of said path laterally of said path in the thickness dimension of the beam for applying an electric field across said path, said separator electrodes being positioned with respect to said magnetic field means so that said electric field is transverse with respect to said magnetic field to separate unwanted ions species laterally from the ion beam to provide an ion beam without scanning deflections;

a wafer wheel positioned in the path of said beam, said wafer wheel being or carrying implantable wafers thereon and being rotatably mounted on an axis substantially parallel to beam path, said wafer wheel being positioned so that the beam leaves a substantially rectangular pattern on the wafer wheel, with the thickness of the beam pattern being substantially radially oriented with respect to the wafer wheel axis and with the height of the pattern being substantially normal to the wafer wheel radius;

means for rotating said wafer wheel about its axis; and means for traversing said wafer wheel in a direction substantially at right angles to the wafer wheel axis and parallel to the thickness dimension of the beam so that wafers on the wafer wheel can be traversed across the beam pattern while the wafer wheel is rotating.

2. The ion implantation system of claim 1 wherein said means to traverse said wafer wheel includes means to traverse said wafer wheel a sufficient distance so that the pattern is on one side of wafers on said wheel at one end of the traverse sand the beam pattern is on the other side of wafers on said wheel at the other end of traverse of said wheel.

3. The ion implantation system of claim 2 wherein said ribbon beam ion source is in a vacuum envelope and said wafer wheel is in a separate target chamber, means for separately providing a vacuum in said ion beam source vacuum envelope and said target chamber;

a beam slot between said ion beam source vacuum envelope and said target chamber for permitting transmission of a ribbon beam from said ion beam source vacuum envelope into said target chamber; and a gate for closing off said ion beam opening so that said target chamber can be opened without opening said ion beam source vacuum envelope.

4. The ion implantation system of Claim 1 wherein said ribbon beam ion source is in a vacuum envelope and said wafer wheel is in a separate target chamber, means for separately providing a vacuum in said ion beam source vacuum envelope and said target chamber;

a beam slot between said ion beam source vacuum envelope and said target chamber for permitting trans mission of a ribbon beam from said ion beam source vacuum envelope into said target chamber; and a gate for closing off said ion beam opening so that said target chamber can be opened without opening said ion beam source vacuum envelope.

5. The ion implantation system of claim 1 wherein said wafer wheel is mounted on a shaft for rotation on said shaft about said axis, said wafer wheel shaft being connected through a spline to a motor so that said wafer wheel shaft can move toward and away from said motor, said wafer wheel shaft being rotatably mounted on a carrier plate, guide bushings on said carrier plate so that said carrier plate can move to traverse said wafer wheel shaft, a traverse motor connected through a screw and a nut to said carrier plate so that rotation of said traverse motor traverses said carrier plate and said wafer wheel while said wafer wheel is rotating on its axis.

* * * * *